(12) United States Patent  
Monreal

(10) Patent No.: US 7,715,219 B2
(45) Date of Patent: May 11, 2010

(54) NON-VOLATILE PROGRAMMABLE MEMORY CELL AND MEMORY ARRAY

(75) Inventor: Gerardo Monreal, Pilar Buenos Aires (AR)

(73) Assignee: Allegro Microsystems, Inc., Worcester, MA (US)

( * ) Notice: Subject to any disclaimer, the term of this patent is extended or adjusted under 35 U.S.C. 154(b) by 104 days.

(21) Appl. No.: 12/164,221

(22) Filed: Jun. 30, 2008

(65) Prior Publication Data

US 2009/0323450 A1    Dec. 31, 2009

(51) Int. Cl.
*G11C 17/00* (2006.01)
(52) U.S. Cl. .................. 365/96; 365/225.7; 365/63
(58) Field of Classification Search ............ 365/96, 365/225.7, 63
See application file for complete search history.

(56) References Cited

U.S. PATENT DOCUMENTS

| | | | |
|---|---|---|---|
| 5,200,652 A | 4/1993 | Lee | |
| 5,412,593 A | 5/1995 | Magel et al. | |
| 5,572,050 A | 11/1996 | Cohen | |
| 5,945,840 A | 8/1999 | Cowles et al. | |
| 6,163,488 A * | 12/2000 | Tanizaki et al. | 365/200 |
| 6,246,623 B1 * | 6/2001 | Ingalls | 365/225.7 |
| 6,346,846 B1 * | 2/2002 | Bertin et al. | 327/525 |
| 6,410,398 B1 | 6/2002 | Forel et al. | |
| 6,469,923 B1 * | 10/2002 | Hidaka | 365/149 |
| 6,545,928 B1 * | 4/2003 | Bell | 365/225.7 |
| 6,653,669 B2 | 11/2003 | Laville et al. | |
| 6,788,607 B2 * | 9/2004 | Duval et al. | 365/225.7 |
| 6,953,971 B2 | 10/2005 | Laville et al. | |
| 6,963,239 B2 * | 11/2005 | Laville et al. | 327/525 |
| 7,499,315 B2 * | 3/2009 | Lowrey et al. | 365/163 |
| 2003/0058725 A1 * | 3/2003 | Bell | 365/225.7 |

(Continued)

FOREIGN PATENT DOCUMENTS

EP        1 211 693 A2    6/2002

(Continued)

OTHER PUBLICATIONS

PCT Search Report and Written Opinion of the ISA for PCT/US2009/047602 dated Sep. 11, 2009.

(Continued)

*Primary Examiner*—Tuan T. Nguyen
(74) *Attorney, Agent, or Firm*—Daly, Crowley, Mofford & Durkee, LLP

(57) ABSTRACT

A non-volatile one time programmable memory cell couples in series a two terminal fuse and a three terminal antifuse. The non-volatile one time programmable memory cell includes a memory cell write enable node and a memory cell output node. The non-volatile one time programmable memory cell includes fuse having a first node and a second node, and an antifuse having a trigger node, a first node, and a second node. The trigger node is coupled to the memory cell write enable node. The first node of the antifuse and the second node of the fuse are coupled to the memory cell output node. First and second voltages appearing at the memory cell output node are indicative of first and second binary states of the memory cell. A plurality of such memory cells can be included in a non-volatile programmable memory array. A non-volatile programmable memory cell capable of re-programming is also included.

27 Claims, 7 Drawing Sheets

U.S. PATENT DOCUMENTS

2006/0262627 A1 11/2006 Fricke et al.
2008/0159042 A1* 7/2008 Bertin et al. ............. 365/225.7

FOREIGN PATENT DOCUMENTS

| EP | 1 211 693 A3 | 6/2002 |
| EP | 1 286 356 A2 | 2/2003 |
| EP | 1 286 356 A3 | 2/2003 |
| EP | 1 298 729 A2 | 4/2003 |
| EP | 1 298 729 A3 | 4/2003 |

OTHER PUBLICATIONS

Laville et al.; "Integrated Offset Trimming Technique;" IEEE; Proceedings of the 27$^{th}$ European Solid-State Circuits Conference; Sep. 18, 2001; 4 pages.

Laville et al.; "Integrated Offset Trimming Technique;" Powerpoint slide presentation; Proceedings of the 27$^{th}$ European Solid-State Circuits Conference; Sep. 18, 2001; 18 pages.

* cited by examiner

NON-VOLATILE PROGRAMMABLE MEMORY CELL AND MEMORY ARRAY

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to memory cells and memory arrays and, more particularly, to a non-volatile programmable memory cell and associated memory array.

BACKGROUND OF THE INVENTION

An integrated circuit memory cell is a circuit capable of storing a predetermined number of logic states, most often two logic states. Based on a capacity of retaining or not retaining a memory state under no power conditions, memory cells can be classified as non-volatile or volatile. In particular, a non-volatile (NV) memory cell is capable of retaining its memory state when powered off. In contrast, a volatile memory loses its memory state when powered off.

All integrated circuit non-volatile programmable memory cells include an alterable element that can be altered from a first condition to a second condition, and which retains its second condition even when power is turned off.

The above-described alteration of the alterable element from the first condition to the second condition is usually referred to as programming the memory cell. In some arrangements, the programming is achieved when the alterable element is subjected to specific voltage, current, or voltage-current (power) condition by means of additional supporting circuitry (i.e., a driver). One time programmable non-volatile memory cells (OTP NV) are a type of non-volatile programmable memory cells, for which programming is not reversible.

In a conventional non-volatile programmable memory array having a plurality of non-volatile programmable memory cells, each memory cell has a particular address location, and therefore requires an address decoder circuit plus a write driver circuit and also a read sensing circuit in order to uniquely program (i.e., write) to or read from a respective memory cell.

In some arrangements, address decoding circuits and read sensing circuits can be shared among memory cells. However, write driver circuits are usually not shared among memory cells, and therefore, each memory cell in a memory array has its own write driver circuit. Write driver circuits are known to be physically large, as they are required to have low source resistances at high current levels. Being physically large, write driver circuits tend to limit the number of non-volatile programmable memory cells that can be fabricated into a memory array in an integrated circuit.

In some conventional non-volatile programmable memory arrays having a plurality of non-volatile programmable memory cells, a state of each memory cell, programmed or unprogrammed, is sensed by a respective read sensing circuit. State detection margin error, power consumption, access time, and silicon area constraints are all tradeoffs that affect the design of read sensing circuits. The requirement for read sensing circuits also tends to limit the number of non-volatile programmable memory cells that can be fabricated in an integrated circuit.

In addition, many types of non-volatile programmable memory cells draw a different amount of current depending upon their logic state. Thus, a conventional non-volatile programmable memory array having a plurality of non-volatile programmable memory cells can draw different amounts of current depending upon the states of memory cells within the memory array and how it is accessed or read. For some electronic systems, this variation may be undesirable.

It would be desirable to have a non-volatile programmable memory cell and an associated non-volatile programmable memory array that can be fabricated with a conventional integrated circuit process and that can achieve a high density of non-volatile programmable memory cells but with a low operational power consumption and a high noise margin state detection.

SUMMARY OF THE INVENTION

The present invention provides a non-volatile programmable memory cell, which couples a two-terminal fuse and a three-terminal antifuse. When the non-volatile programmable memory cell is combined with other non-volatile programmable memory cells in a non-volatile programmable memory array, the non-volatile programmable memory cells can share a common pair of power rails. Therefore, the non-volatile programmable memory array only requires a single common write driver circuit and a single common read driver circuit.

Furthermore, in some embodiments, the non-volatile programmable memory cell can utilize common devices or structures used by conventional CMOS or BiCMOS technologies, which can provide a memory cell output signal compatible with common CMOS logic levels. A high density of non-volatile programmable memory cells can be fabricated in a non-volatile programmable memory array in an integrated circuit.

In accordance with one aspect of the present invention, a memory cell includes a memory cell write enable node and a memory cell output node. The memory cell also includes a fuse having a first node and a second node, and an antifuse having a trigger node, a first node, and a second node. The trigger node is coupled to the memory cell write enable node. The first node of the antifuse and the second node of the fuse are coupled to the memory cell output node. First and second voltages appearing at the memory cell output node are indicative of first and second binary states of the memory cell.

In accordance with another aspect of the present invention, a memory array has a plurality of memory cells. The plurality of memory cells includes a corresponding plurality of memory cell write enable nodes and a corresponding plurality of memory cell output nodes. The plurality of memory cells also includes a corresponding plurality of fuses, each fuse having a first respective node and a second respective node. The plurality of memory cells also includes a corresponding plurality of antifuses. Each antifuse has a respective trigger node, a respective first node, and a respective second node. The trigger node of each fuse is coupled to respective one of the plurality of memory cell write enable nodes. The second node of each fuse and the first node of each antifuse are coupled to a respective one of a plurality of memory cell output nodes. Respective first and second voltages appearing at each one of the plurality of memory cell output nodes are indicative of respective first and second binary states of each respective one of the plurality of memory cells.

In accordance with another aspect of the present invention, a memory cell includes first and second memory cell write enable nodes and a memory cell output node. The memory cell also includes a first fuse having a first node and a second node. The memory cell also includes a first antifuse having a trigger node, a first node, and a second node. The first node of the first antifuse is coupled to the second node of the first fuse. The trigger node of the first antifuse is coupled to the first memory cell write enable node. The memory cell also includes a second fuse having a first node and a second node. The first node of the second fuse is coupled to the second node of the first fuse. The memory cell also includes a second antifuse having a trigger node, a first node, and a second node. The trigger node of the second antifuse is coupled to the second memory cell write enable node. The first node of the second antifuse and the second node of the second fuse are coupled to the memory cell output node. The second node of the second antifuse is coupled to the first node of the first fuse. With this arrangement, the memory cell is can be programmed more than once.

BRIEF DESCRIPTION OF THE DRAWINGS

The foregoing features of the invention, as well as the invention itself may be more fully understood from the following detailed description of the drawings, in which:

FIG. 1A is a block diagram showing another type of non-volatile programmable memory cell;

DETAILED DESCRIPTION OF THE INVENTION

Before describing the present invention, some introductory concepts and terminology are explained. As used herein, the term "antifuse" is used to describe a device, which normally has a relatively high resistance, for example, greater than one megohm, and which can be programmed to have a relatively low resistance, for example, one hundred Ohms. Antifuses exist in a variety of forms, including, but not limited to NMOS and PMOS field effect transistor (FET) transistor based antifuses.

Conventional antifuses are two terminal devices and are changed from a high resistance condition to a low resistance condition by applying particular voltage-current conditions across the two terminals. For example, zener zapping antifuses and oxide breakdown antifuses are two conventional types of two terminal antifuses. It should be appreciated that, for such two terminal devices, if a multiplicity of them is placed in parallel, there is no way to program a particular antifuse without programming the others.

Contrary to the conventional antifuse, antifuses described herein are three terminal devices, which are changed from a high resistance condition to a low resistance condition by application of a voltage between two terminals in combination with application of a "write signal" to a "trigger node" in a way described below in conjunction with FIG. 6. The trigger node is essentially coupled to a base of a bipolar transistor. The bipolar transistor has a collector to emitter breakdown voltage that is a function of a base potential.

As used herein, the term "fuse" is used to describe a device, which normally has a relatively low resistance, for example 0.1 Ohms, and which can be programmed to have a relatively high resistance, for example, greater than one megohm. Fuses exist in a variety of forms, including, but not limited to, metal or Polysilicon fuses.

Figure 1:
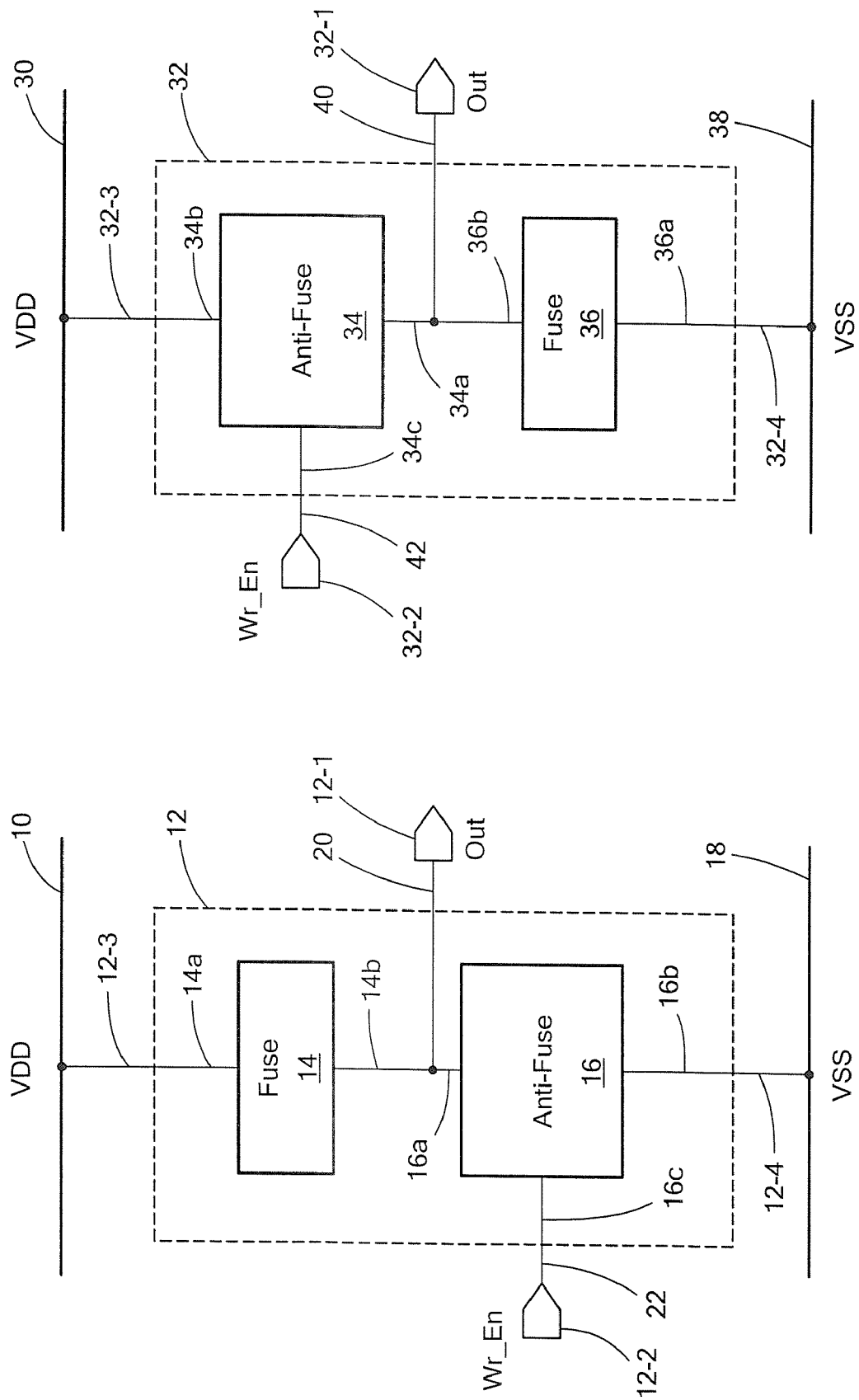
FIG. 1 is a block diagram showing a type of non-volatile programmable memory cell.

Referring to FIG. 1, an exemplary non-volatile programmable memory cell 12 includes a memory cell write enable node 12-2 and a memory cell output node 12-1. The memory cell also includes a fuse 14 having a first node 14a and a second node 14b. The memory cell 12 also includes an antifuse 16 having a trigger node 16c, a first node 16a, and a second node 16b. The trigger node 16c is coupled to the memory cell write enable node 12-2. The first node 16a of the antifuse 16 and the second node 14b of the fuse 14 are coupled to the memory cell output node 12-1. In operation, a signal 20 having first and second voltages appears at the memory cell output node 12-1, in particular when a voltage difference is applied between the first node 14a o the fuse 14 and the second node 16b of the antifuse 16. The first and second voltages are indicative of first and second binary states of the memory cell 12.

Initially, before programming the memory cell 12, the fuse 14 has a lower initial resistance between the first node 14a and the second node 14b of the fuse 14 compared to a higher initial resistance of the antifuse 16 between the first node 16a and the second node 16b of the antifuse 16.

After programming the memory cell 12, the fuse 14 has a higher programmed resistance between the first node 14a and the second node 14b of the fuse 14 compared to the lower initial resistance of the fuse 14, and the antifuse 16 has a lower programmed resistance between the first node 16a and the second node 16b of the antifuse 16 compared to both the higher initial resistance of the antifuse 16 and the higher programmed resistance of the fuse 14.

In some embodiments, initially, before programming the memory cell 12, a resistance between the first node 14a of the fuse 14 and the second node 16b of the antifuse 16 is greater than about one megohm, and, after programming the memory cell 12, the resistance between the first node 14a of the fuse 14 and the second node 16b of the antifuse 16 is also greater than about one megohm.

In some embodiments, the memory cell 12 has substantially the same resistance between the first node 14a of the fuse 14 and the second node 16b of the antifuse 16 before and after programming the memory cell 12. Accordingly, in some embodiments, the memory cell 12 has substantially the same power consumption before and after programming the memory cell 12.

During a programming operation, the first node 14a of the fuse 14 and the second node 16b of the antifuse 16 are coupled to receive a write voltage difference between a VDD voltage bus 10 and a VSS voltage bus 18. During a read operation, the first node 14a of the fuse 14 and the second node 16b of the antifuse 16 are coupled to receive a read voltage difference. In some embodiments, the read voltage difference is different than the write voltage difference.

It should be appreciated that, when describing the write voltage or the read voltage herein, it is presumed that the write voltage or the read voltage pertain to a voltage difference between the VDD voltage bus 10 and the VSS voltage bus 18. In some embodiments, the VSS voltage bus 18 is tied to a ground or zero volts.

A node 12-3 of the memory cell 12 is coupled to the VDD voltage bus 10 and to the first node 14a of the fuse. A node 12-4 of the memory cell 12 is coupled to a VSS voltage bus 18 and to the second node 16b of the antifuse 16. A voltage appearing on the VDD voltage bus 10 is higher than a voltage appearing on the VSS voltage bus 18.

Programming of and reading of the memory cell 12 will be better understood from the discussion below in conjunction with FIGS. 2-6. However, during programming of the memory cell 12 from the first binary state to the second binary state, the antifuse 16 is configured to receive a predetermined voltage-current signal 22 at a write enable node 12-2, which is coupled to the trigger node 16c, and, in response to the predetermined voltage-current signal 22 in combination with a write voltage appearing on the VDD voltage bus 10 (i.e., between nodes 12-3 and 12-4), the antifuse 16 is configured to irreversibly change resistance to have a lower programmed resistance between the first node 16a and the second node 16b of the antifuse 16 compared to a higher initial resistance of the antifuse 16. Thereafter, in response to the antifuse 16 changing resistance, the fuse 14 is configured to irreversibly change resistance, i.e., to blow, so as to have a higher programmed resistance between the first node 14a and the second node 14b of the fuse 14 compared to both a lower initial resistance of the fuse 14 and the lower programmed resistance of the antifuse 16, resulting in a change of the voltage 20 appearing at the memory cell output node 12-1 from the first voltage to the second voltage (when a read voltage is applied across nodes 12-3 and 12-4). For programming, the predetermined voltage-current signal 22 is above a voltage appealing on the VSS voltage bus 18.

In some arrangements, the first voltage, corresponding to the first binary state, is in the range of two to five volts, and the second voltage, corresponding to the second binary state is in the range of zero to 0.5 volts.

Referring now to FIG. 1A, another exemplary non-volatile programmable memory cell 32 includes a memory cell write enable node 32-2 and a memory cell output node 32-1. The memory cell 32 also includes a fuse 36 having a first node 36a and a second node 36b. The memory cell 32 also includes an antifuse 34 having a trigger node 34c, a first node 34a, and a second node 34b. The trigger node 34c is coupled to the memory cell write enable node 32-2. The first node 34a of the antifuse 34 and the second node 36b of the fuse 36 are coupled to the memory cell output node 32-1. In operation, a signal 40 having first and second voltages appears at the memory cell output node 32-1, in particular when a voltage difference is applied between the first node 36a of the fuse 36 and the second node 34b of the antifuse 34. The first and second voltages are indicative of first and second binary states of the memory cell 32.

Initially, before programming the memory cell 32, the fuse 36 has a lower initial resistance between the first node 36a and the second node 36b of the fuse 36 compared to a higher initial resistance of the antifuse 34 between the first node 34a and the second node 34b of the antifuse 34.

After programming the memory cell 32, the fuse 36 has a higher programmed resistance between the first node 36a and the second node 36b of the fuse 36 compared to the lower initial resistance of the fuse 36, and the antifuse 34 has a lower programmed resistance between the first node 34a and the second node 34b of the antifuse 34 compared to both the higher initial resistance of the antifuse 34 and the higher programmed resistance of the fuse 36.

In some embodiments, initially, before programming the memory cell 32, a resistance between the first node 36a of the fuse 36 and the second node 34b of the antifuse 34 is greater than about one megohm, and, after programming the memory cell 32, the resistance between the first node 36a of the fuse 36 and the second node 34b of the antifuse 34 is also greater than about one megohm.

In some embodiments, the memory cell 32 has substantially the same resistance between the first node 36a of the fuse 36 and the second node 34b of the antifuse 34 before and after programming the memory cell 32. Accordingly, in some embodiments, the memory cell 32 has substantially the same power consumption before and after programming the memory cell 32.

During a programming operation, the first node 36a of the fuse 36 and the second node 34b of the antifuse 34 are coupled to receive a write voltage difference between the VDD voltage bus 30 and the VSS voltage bus 38. During a read operation, the first node 36a of the fuse 36 and the second node 34b of the antifuse 34 are coupled to receive a read voltage difference. In some embodiments, the read voltage is different than the write voltage.

It should be appreciated that, when describing the write voltage or the read voltage herein, it is presumed that the write voltage or the read voltage pertain to a voltage difference between the VDD voltage bus 30 and the VSS voltage bus 38. In some embodiments, the VSS voltage bus 38 is tied to a ground or zero volts.

A node 32-3 of the memory cell 32 is coupled to the VDD voltage bus 30 and to the second node 34b of the antifuse 34. A node 32-4 of the memory cell 32 is coupled to a VSS voltage bus 38 and to the first node 36a of the fuse 36. A voltage appearing on the VDD voltage bus 30 is higher than a voltage appearing on the VSS voltage bus 38.

Programming of and reading of the memory cell 32 will be better understood from the discussion below in conjunction with FIGS. 2-6. However, during programming of the memory cell 32 from the first binary state to the second binary state, the antifuse 34 is configured to receive a predetermined voltage-current signal 42 at a write enable node 32-2, which is coupled to the trigger node 34c, and, in response to the predetermined voltage-current signal 42 in combination with a write voltage appearing on the VDD voltage bus 30 (i.e., across nodes 32-3 and 32-4), the antifuse 34 is configured to irreversibly change resistance to have a lower programmed resistance between the first node 34a and the second node 34b of the antifuse 34 compared to a higher initial resistance of the antifuse 34. Thereafter, in response to the antifuse 34 changing resistance, the fuse 36 is configured to irreversibly change resistance (i.e., to blow) to have a higher programmed resistance between the first node 36a and the second node 36b of the fuse 36 compared to both a lower initial resistance of the fuse 36 and the lower programmed resistance of the antifuse 34, resulting in a change of the voltage 40 appearing at the memory cell output node 32-1 from the first voltage to the second voltage (when a read voltage is applied across nodes 32-3 and 32-4). For programming, the predetermined voltage-current signal 42 is below a voltage appearing on the VDD voltage bus 30.

In some arrangements, the first voltage, corresponding to the first binary state, is in the range of zero to 0.5 volts, and the second voltage, corresponding to the second binary state, is in the range of two to five volts. It will be recognized that the voltages of the first and second binary states for the memory cell 32 are opposite from the voltages of the first and second binary states for the memory cell 12 of FIG. 1.

Figure 2:
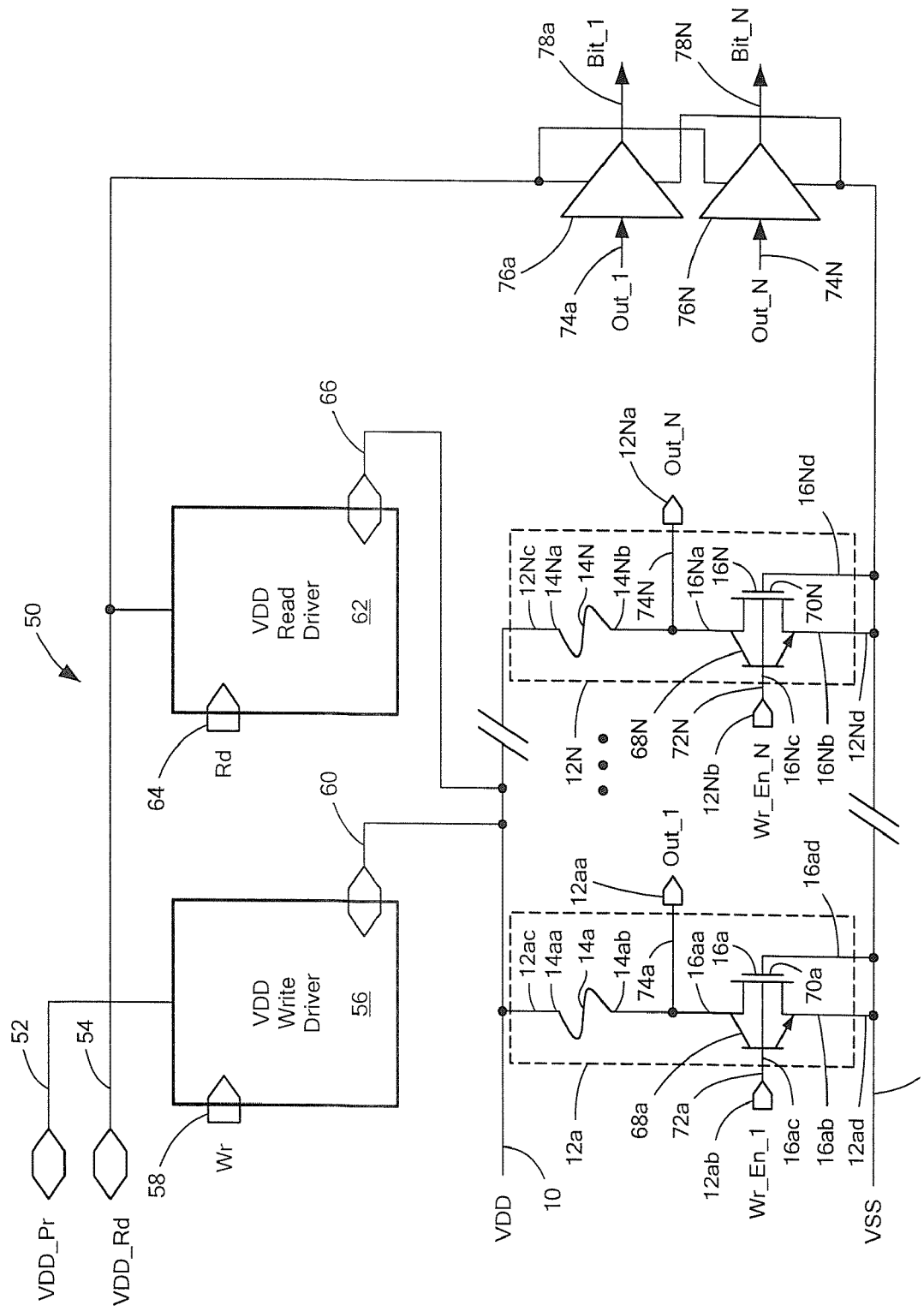
FIG. 2 is a block diagram showing a non-volatile programmable memory array having a plurality of non-volatile programmable memory cells of the type shown in FIG. 1 and having a single read driver circuit and a single write driver circuit.

Referring now to FIG. 2, a non-volatile programmable memory array 50 includes a plurality of memory cells 12a-12N, each of a type of memory cell 12 described above in conjunction with FIG. 1, but with an additional designation letter a through N indicative of an instance of the memory cell 12. For example, memory cell 12a is an a-th instance of the memory cell 12 of FIG. 1, having nodes 12aa, 12ab, 12ac, and 12ad, which are a-th instance of nodes 12a, 12b, 12c, and 12d of FIG. 1.

The memory cells 12a-12N are coupled between the VDD voltage bus 10 (also see FIG. 1) and the VSS voltage bus 18 (also see FIG. 1). The VDD voltage bus 10 and the VSS voltage bus 18 are common to all memory cells 12a-12N. As described above, a voltage appearing on the VDD voltage bus 10 is higher than a voltage appearing on the VSS voltage bus 18.

The antifuses 16a-16N of the memory cells 12a-12N are shown in greater detail than in FIG. 1. For some semiconductor fabrication processes, the antifuses 16a-16N can be implemented as parasitic lateral NPN transistors 68a-68N present in any N-type MOS (NMOS) devices 70a-70N, respectively. However, for other semiconductor fabrication processes, the antifuses 16a-16N can be implemented as bipolar NPN transistor 68a-68N, respectively.

A write enable signal, for example, a write enable signal 72a appearing at the write enable node 12ab, and therefore at the trigger node 16ac, which is higher in voltage than a voltage appearing on the VSS voltage bus 18, tends to cause the antifuse 16a to first turn on, then, if a voltage difference between the VDD voltage bus 10 and the VSS voltage bus 18 is within a programming voltage window, to breakdown, and finally, to thermally runaway, irreversibly becoming a lower resistance than prior to application of the trigger signal. This operation and the programming voltage window are described in greater detail in conjunction with FIG. 6.

The VDD voltage bus 10 is coupled to receive a write voltage 60 from a VDD write driver circuit 56. The VDD voltage bus 10 is also coupled to receive a read voltage 66 from a VDD read driver circuit 62. In some embodiments, the read voltage 66 and the write voltage 60 are different voltages. In some embodiments, the read voltage 66 is lower than the write voltage 60. In some embodiments, the read and write voltages 66, 60 are the same. In some embodiments, the VSS voltage bus 18 is coupled to ground or zero volts.

In some embodiments, the write voltage 60 is about ten volts above and the read voltage 66 is about three volts above the VSS voltage bus 18. In some embodiments, the write enable signal 72a is clamped to 0.7 volts above the VSS voltage bus 18 by the base-emitter diode of the parasitic NPN transistor 68a.

At any particular time, the VDD voltage bus 10 receives only one of the voltages 60, 66. In particular, during programming of the memory 50, the VDD voltage bus 10 receives the write voltage 60, and during reading of the memory 50, the VDD voltage bus 10 receives the read voltage 66. The voltage appearing on the VDD voltage bus is determined in accordance with write and read signals received at a write (Wr) node 58 and a read (Rd) node 64, respectively.

The VDD write driver circuit 56 is coupled to receive a voltage 52, which can be the same as or similar to the write voltage 60, but which can be continuous rather than under control of the write signal received at the write node 58. Similarly, the VDD read driver circuit 62 is coupled to receive a voltage 54, which can be the same as or similar to the read voltage 66, but which can be continuous rather than under control of the read signal received at the read node 64.

As described above in conjunction with FIG. 1, during programming of a memory cell, for example, the memory cell 12a, from the first binary state to the second binary state, the antifuse 16a is configured to receive a write enable signal in the form of a predetermined voltage-current signal 72a at the write enable node 12ab, and therefore, at the trigger node 16ac, and, in response to the predetermined voltage 72a or the predetermined current 72a in combination with the write voltage 60 appearing on the VDD voltage bus 10, the antifuse 16a is configured to irreversibly change resistance to have a lower programmed resistance between the first node 16aa and the second node 16ab of the antifuse 16a compared to a higher initial resistance of the antifuse 16a. Thereafter, in response to the antifuse 16a changing resistance, the fuse 14a is configured to irreversibly change resistance, i.e., to blow, to have a higher programmed resistance between the first node 14aa and the second node 14ab of the fuse 14a compared to both a lower initial resistance of the fuse 14a and the lower programmed resistance of the antifuse 16a, resulting in a change of the voltage 20a appearing at the memory cell output node 12aa from the first voltage to the second voltage.

The first and second voltages can be those generated when the read voltage 66 appears on the VDD voltage bus 10. If the read voltage 66 is, for example, five volts, and a voltage appearing on the VSS voltage bus 18 is about zero volts, i.e., ground, then the first voltage appearing at the output node 74a, prior to programming, is about five volts, and the second voltage, appearing at the output node 74a after programming is about zero volts. Each one of the memory cells 12a-12N is programmed and behaves in the same way, in accordance with signals applied to respective trigger input nodes 16ac-16Nc.

In some embodiments, output driver circuits 76a-76N are coupled to receive memory cell output signals 74a-74N and to provide buffered output signals 78a-78N, respectively.

In some alternate arrangements, the write drive circuit 56 and the read driver circuit 62 are not used. Instead, the voltage 52 and the voltage 54 are received from outside the memory array 50, one at a time, and are directly coupled to the VDD voltage bus 10 depending upon whether a programming of the memory array 50 is occurring or if a reading of the memory array 50 is occurring. Similar alternate arrangements are also possible with memory arrays shown below in FIGS. 3-5, but are not described again.

Figure 3:
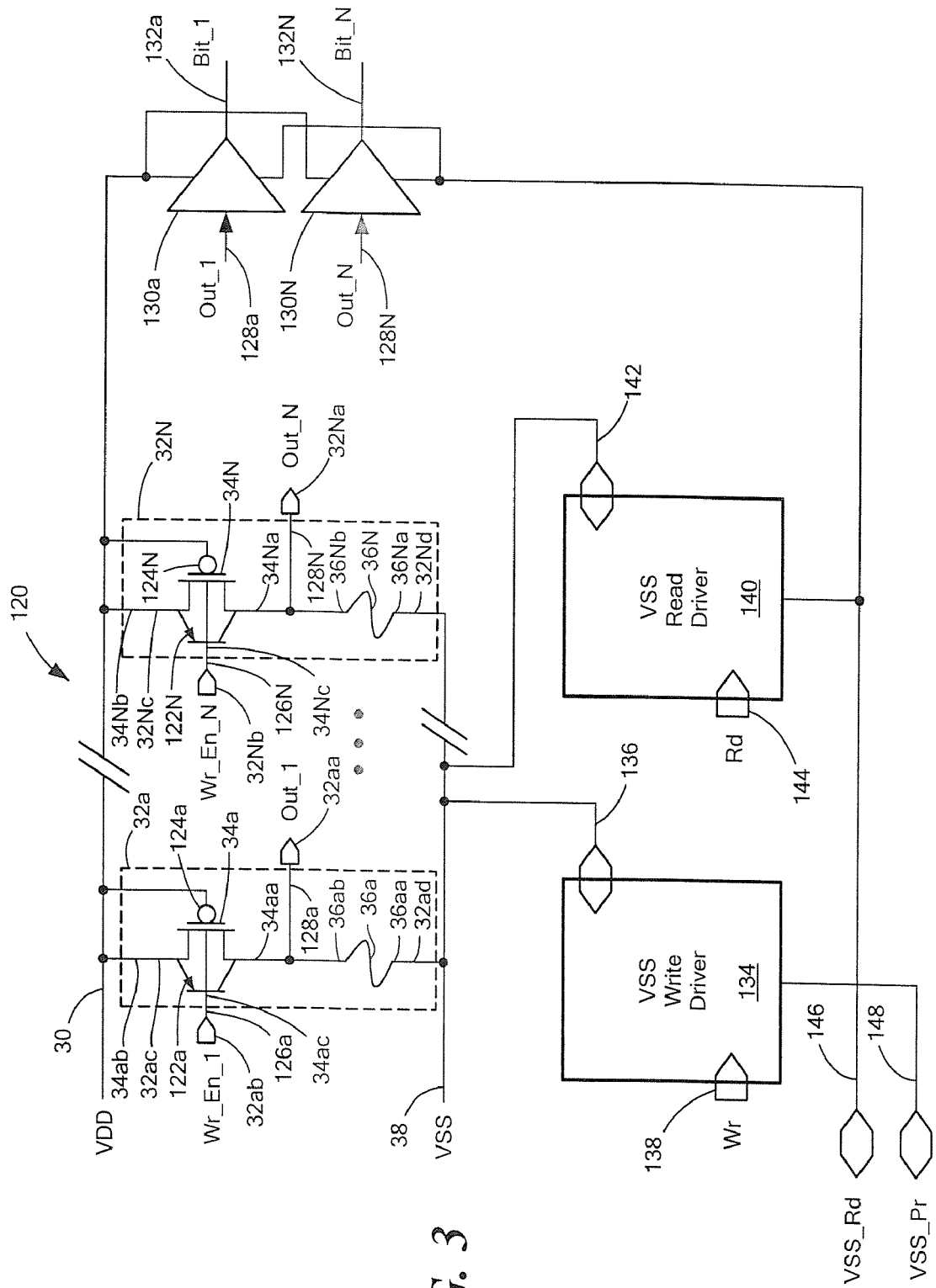
FIG. 3 is a block diagram showing another non-volatile programmable memory having a plurality of non-volatile programmable memory cells of the type shown in FIG. 2 and having a single read driver circuit and a single write driver circuit.

Referring now to FIG. 3, a non-volatile programmable memory array 120 includes a plurality of memory cells 32a-32N, each of a type of memory cell 32 described above in conjunction with FIG. 1A, but with an additional designation letter a through N indicative of an instance of the memory cell 32. For example, memory cell 32a is an a-th instance of the memory cell 32 of FIG. 1A, having nodes 32aa, 32ab, 32ac, and 32ad, which are a-th instance of nodes 32a, 32b, 32c, 32d of FIG. 1A.

The memory cells 32a-32N are coupled between the VDD voltage bus 30 (also see FIG. 1A) and the VSS voltage bus 38 (also see FIG. 1A). The VDD voltage bus 30 and the VSS voltage bus 38 are common to all memory cells 32a-32N. As described above, a voltage appearing on the VDD voltage bus 30 is higher than a voltage appearing on the VSS voltage bus 38.

The antifuses 34a-34N of the memory cells 32a-32N are shown in greater detail than in FIG. 1A. For some semiconductor fabrication processes, the antifuses 34a-34N can be implemented as parasitic lateral PNP transistors 122a-122N present in any P-type MOS (PMOS) devices 124a-124N, respectively. However, for other semiconductor fabrication processes, the antifuses 34a-34N can be implemented as bipolar PNP transistors 122a-122N, respectively.

A write enable signal, for example, a write enable signal 126a appearing at the write enable node 32ab, and therefore at the trigger node 34ac, which is lower in voltage than a voltage appearing on the VDD voltage bus 30, tends to cause the antifuse 34a to first turn on, then, if a voltage difference between the VDD voltage bus 30 and the VSS voltage bus 38 is within a programming voltage window, to breakdown, and finally, to thermally runaway, irreversibly becoming a lower resistance than prior to application of the trigger signal. This operation and the programming voltage window are described in greater detail in conjunction with FIG. 6.

The VSS voltage bus 30 is coupled to receive a write voltage 136 from a VSS write driver circuit 134. The VSS voltage bus 38 is also coupled to receive a read voltage 142 from a VSS read driver circuit 140. In some embodiments, the read voltage 142 and the write voltage 136 are different voltages. In some embodiments, the read voltage 142 is lower (i.e., less negative) than the write voltage 136. In some embodiments, the read and write voltages 142, 136 are the same. In some embodiments, the VDD voltage bus 30 is coupled to ground or zero volts.

In some embodiments, the write voltage 136 is about ten volts below and the read voltage 142 is about three volts below the VDD voltage bus 30. In some embodiments, the write enable signal 126a is clamped to about 0.7 volts below the VDD voltage bus 30 by the base-emitter parasitic diode of the parasitic PNP transistor 122a.

At any particular time, the VSS voltage bus 30 receives only one of the voltages 136, 142. In particular, during programming of the memory 120, the VSS voltage bus 38 receives the write voltage 136, and during reading of the memory 120, the VSS voltage bus 38 receives the read voltage 142. The voltage appearing on the VSS voltage bus 38 is determined in accordance with voltage or current write or read signals received at a write (Wr) node 138 and a read (Rd) node 144, respectively.

The VSS write driver circuit 134 is coupled to receive a voltage 148, which can be the same as or similar to the write voltage 136, but which can be continuous rather than under control of the write signal received at the write node 138. Similarly, the VSS read driver circuit 40 is coupled to receive a voltage 146, which can be the same as or similar to the read voltage 142, but which can be continuous rather than under control of the read signal received at the read node 144.

As described above in conjunction with FIG. 1A, during programming of a memory cell, for example, the memory cell 32a, from the first binary state to the second binary state, the antifuse 34a is configured to receive a write enable signal in the form of a predetermined voltage-current signal 126a at the write enable node 32ab, and therefore, at the trigger node 34ac, and, in response to the predetermined voltage 126a or the predetermined current 126a in combination with the write voltage 136 appearing on the VSS voltage bus 38, the antifuse 34a is configured to irreversibly change resistance to have a lower programmed resistance between the first node 34aa and the second node 34ab of the antifuse 34a compared to a higher initial resistance of the antifuse 34a. Thereafter, in response to the antifuse 34a changing resistance, the fuse 36a is configured to irreversibly change resistance, i.e., to blow, to have a higher programmed resistance between the first node 36aa and the second node 36ab of the fuse 36a compared to a lower initial resistance of the fuse 36a, resulting in a change of the voltage 128a appearing at the memory cell output node 32aa from the first voltage to the second voltage.

The first and second voltages can be those generated when the read voltage 142 appears on the VSS voltage bus 38. If the read voltage 142 is, for example, negative five volts, i.e., and a voltage appearing on the VDD voltage bus 32 is about zero volts, then the first voltage appearing at the output node 128a, prior to programming, is about zero volts, and the second voltage, appearing at the output node 126a after programming, is about negative five volts. Each one of the memory cells 32a-32N is programmed and behaves in the same way, in accordance with signals applied to respective trigger input nodes 34ac-34Nc.

In some embodiments, output driver circuits 130a-130N are coupled to receive memory cell output signals at nodes 128a-128N and to provide buffered output signals 132a-132N, respectively.

Figure 4:
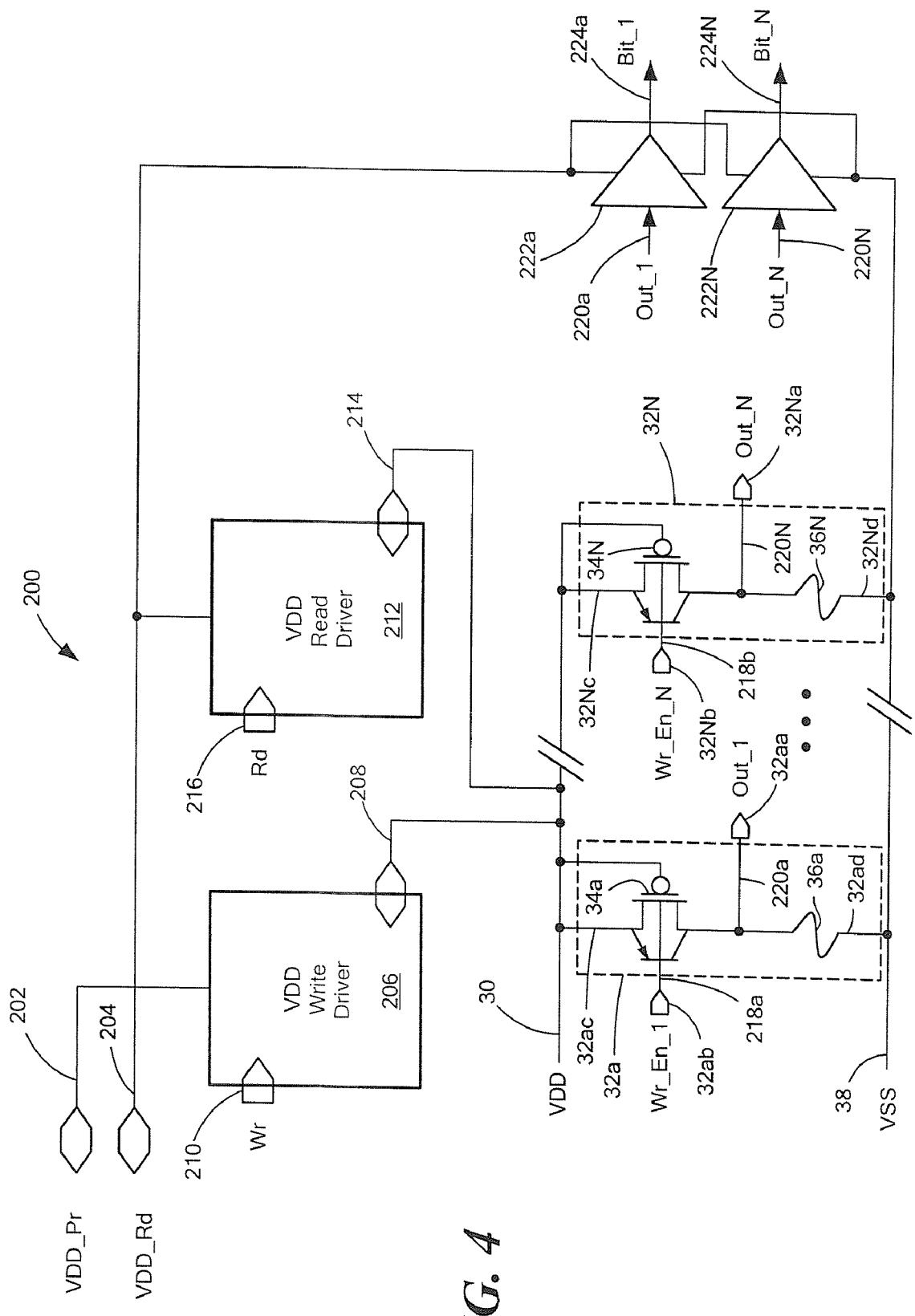
FIG. 4 is a block diagram showing another non-volatile programmable memory having a plurality of non-volatile programmable memory cells of the type shown in FIG. 2 and having a single read driver circuit and a single write driver circuit.

Referring now to FIG. 4, a non-volatile programmable memory array 200 is similar to the non-volatile programmable memory array 50 of FIG. 2. However, the memory array 200 includes the memory cells 32a-32N of FIG. 3 instead of the memory cells 12a-12N of FIG. 2.

The VDD voltage bus 30 is coupled to receive a write voltage 208 from a VDD write driver circuit 206. The VDD voltage bus 30 is also coupled to receive a read voltage 214 from a VDD read driver circuit 212. The write voltage 208 can be the same as or similar to the write voltage 60 of FIG. 2 and the read voltage 214 can be the same as or similar to the read voltage 66 of FIG. 2. In some embodiments, the VSS voltage bus 38 is coupled to ground or zero volts.

At any particular time, the VDD voltage bus 30 receives only one of the voltages 208, 214. In particular, during programming of the memory 200, the VDD voltage bus 30 receives the write voltage 208, and during reading of the memory 200, the VDD voltage bus 30 receives the read voltage 214. The voltage appearing on the VDD voltage bus 10 is determined in accordance with voltage or current write and read signals received at a write (Wr) node 210 and a read (Rd) node 218, respectively.

A write enable signal, for example, a write enable signal 218a, which is lower in voltage than a voltage appearing on the VDD voltage bus 30, tends to cause the antifuse 16a to fuse, becoming a lower resistance than prior to application of the trigger signal 218a.

The VDD write driver circuit 210 is coupled to receive a voltage 202, which can be the same as or similar to the write voltage 208, but which can be continuous rather than under control of the write signal received at the write node 210. Similarly, the VDD read driver circuit 212 is coupled to receive a voltage 204, which can be the same as or similar to the read voltage 214, but which can be continuous rather than under control of the read signal received at the read node 216.

In some embodiments, output driver circuits 222a-222N are coupled to receive memory cell output signals 220a-220N and to provide buffered output signals 224a-224N, respectively.

Figure 5:
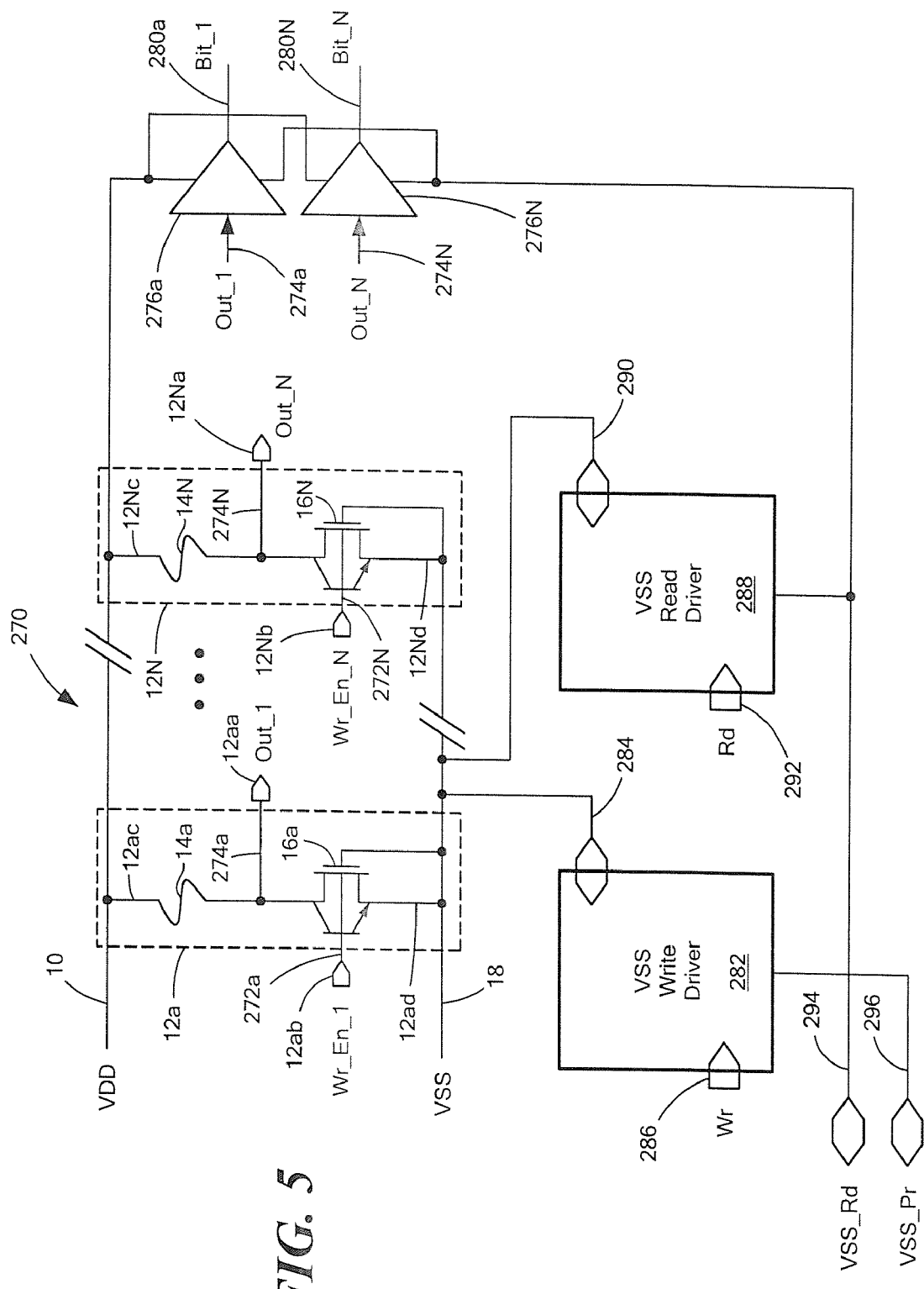
FIG. 5 is a block diagram showing another non-volatile programmable memory having a plurality of non-volatile programmable memory cells of the type shown in FIG. 1 and having a single read driver circuit and a single write driver circuit.

Referring now to FIG. 5, a non-volatile programmable memory array 270 is similar to the non-volatile programmable memory array 120 of FIG. 3. However, the memory array 270 includes the memory cells 12a-12N of FIG. 2 instead of the memory cells 32a-32N of FIG. 3.

The VSS voltage bus 18 is coupled to receive a write voltage 284 from a VSS write driver circuit 282. The VSS voltage bus 18 is also coupled to receive a read voltage 290 from a VSS read driver circuit 288. The write voltage 284 can be the same as or similar to the write voltage 136 of FIG. 3 and the read voltage 290 can be the same as or similar to the read voltage 142 of FIG. 3. In some embodiments, the VDD voltage bus 10 is coupled to ground or zero volts.

At any particular time, the VSS voltage bus 18 receives only one of the voltages 284, 290. In particular, during programming of the memory 270, the VSS voltage bus 18 receives the write voltage 284, and during reading of the memory 270, the VSS voltage bus 18 receives the read voltage 290. The voltage appearing on the VSS voltage bus 18 is determined in accordance with voltage or current write and read signals received at a write (Wr) node 286 and a read (Rd) node 292, respectively.

A write enable signal, for example, a write enable signal 272a, which is higher in voltage than a voltage appearing on the VSS voltage bus 18, tends to cause the antifuse 16a to fuse, becoming a lower resistance than prior to application of the trigger signal.

The VSS write driver circuit 282 is coupled to receive a voltage 296, which can be the same as or similar to the write voltage 282, but which can be continuous rather than under control of the write signal received at the write node 286. Similarly, the VSS read driver circuit 288 is coupled to receive a voltage 294, which can be the same as or similar to the read voltage 290, but which can be continuous rather than under control of the read signal received at the read node 292.

In some embodiments, output driver circuits 276a-276N are coupled to receive memory cell output signals 274a-274N and to provide buffered output signals 280a-280N, respectively.

Figure 6:
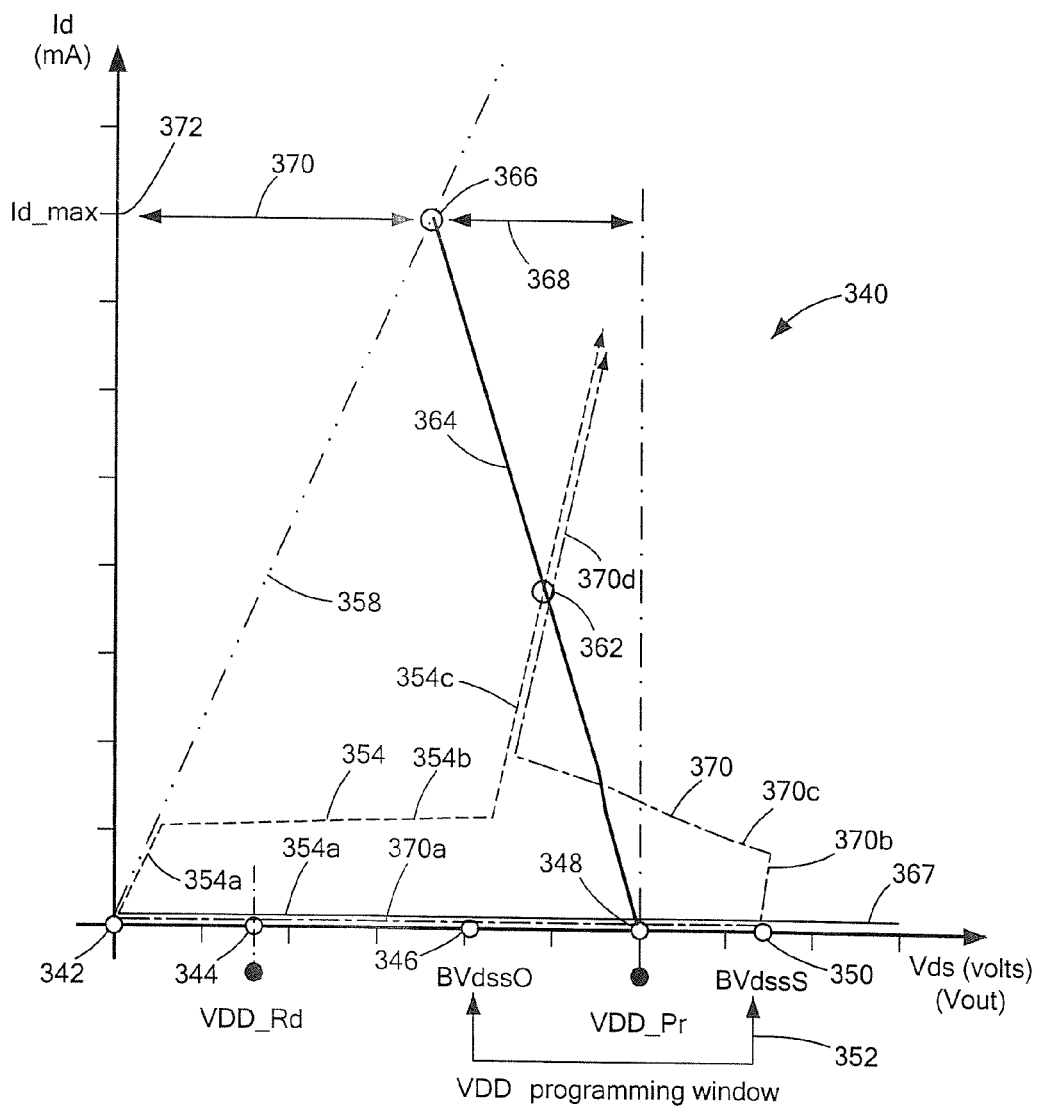
FIG. 6 is a graph indicative of a programming for a non-volatile programmable memory cell, for example, the a non-volatile programmable memory cell of FIG. 1.

Referring now to FIG. 6, a graph 340 has a horizontal axis with a scale in units of memory cell output node voltage and a vertical axis with a scale in units of memory cell current. Taking the memory cell 12a of FIG. 2 as an example, the memory cell output node voltage corresponds to voltage appearing at the node 12aa, which in some embodiments, is the same as the voltage between the first and second nodes 16aa, 16ab of the NMOS FET 70a, i.e., a drain-source voltage. The memory cell current corresponds to a current passing from the first node 12ac to the second node 12ad, which in some embodiments, is essentially the same as the drain current passing through the NMOS FET 70a.

A point 350 corresponds to a maximum drain-source breakdown voltage when a write voltage 60 (FIG. 2) corresponding to the point 350 is applied to the memory cell 12a, and when the write enable signal 72a is low, i.e. zero volts. The point 350 is known as the BVdssS referring to the Drain Source Breakdown Voltage with (s)horted to ground gate and (S)horted to ground bulk. In this condition, a low impedance path is formed between nodes 16aa and 16ab and drain current will start flowing through the NMOS FET 70a due to drain-body junction avalanche breakdown. Therefore, when a voltage at or above the drain-source breakdown voltage 350 is applied to the memory cell, e.g., 12a of FIG. 2, the memory cell 12a is triggered, regardless of the write enable signal 72a, causing the antifuse 16a (FIG. 2) to operate as a two terminal device. In other words, if the write voltage 60 of FIG. 2 (or more particularly if a difference between the write voltage 60 and the VSS voltage bus 18) is sufficiently above the drain-source breakdown voltage 350, unwanted programming of the memory cell 12a will occur.

A point 346 corresponds to a minimum drain-source breakdown voltage, which is obtained when a write voltage 60 (FIG. 2) corresponding to the point 346 is applied to the memory cell 12a, and when the write enable signal 72a is high, i.e. forward biasing the body-source diode between nodes 16aa and 16ab. In this condition, a low impedance path is formed between the nodes 16aa and 16ab and drain current will start flowing through the NMOS FET 70a due to drain-body junction avalanche breakdown and the multiplication factor provided by the action of the parasitic Drain-Body-Source lateral NPN bipolar transistor. Therefore, applying a voltage lower than the voltage at the point 346 will produce no programming effect to the memory cell. This point 346 is known as the BVdssO referring to the Drain Source Breakdown Voltage with (s)horted to ground gate and (O)pen bulk. The two above described breakdown voltage levels 350 and 346 correspond to boundaries of a programming window 352. Applying a drain-source voltage within the programming window 352, e.g., a voltage corresponding to a point 348, causes the antifuse to operate as a three terminal device, which fuses only in response to the write enable signal 72a.

The point 348 corresponds to a drain-source voltage below the drain-source breakdown voltage 350 also when the write signal 72a (FIG. 2) is low, i.e., zero volts. In this condition, no drain current flows through the antifuse 16a and the memory cell 12a remains un-programmed.

In order to describe the programming mechanism of the memory cell described herein, fuse and antifuse branch current and its relationship to voltage at the output cell node is described below. As the current is the same for both the fuse and the antifuse, a graphical solution can be obtained by intersecting characteristics curves of both elements.

A curve 370 having portions 370a, 370b, 370c and 370e corresponds to a characteristic curve of the antifuse 16a (FIG. 2) before programming, when the write enable signal 72a is low, i.e., when a short circuit exists between the nodes 16ac and 16ab.

A curve 354 having portions 354a, 354b, 354c corresponds to a characteristic curve of the antifuse 16a (FIG. 2) before programming, when the write enable signal 72a is high, which forward biases the body-source junction of the FET 16a with a current different than zero A curve 358 corresponds to a characteristic curve of the antifuse 16a (FIG. 2) after it has been programmed, resulting in a low resistance (nearly a short circuit) between the drain 16aa and the source 16ab of the antifuse 16a.

A curve 364 corresponds to a characteristic curve of the fuse 14a (FIG. 2) before programming, i.e., a very low impedance.

A curve 367 corresponds to a characteristic curve of the fuse 14a (FIG. 2) after programming, resulting in a very high impedance.

In normal programming operation, beginning at the point 348, the write voltage 60 (FIG. 2) is first applied to the memory cell 12a (FIG. 2) (i.e., to the VDD voltage bus 10, FIG. 2) while the write enable signal 72a is kept low. Under this condition, memory cell current, i.e., current passing through the fuse 14a and antifuse 16a, is equal to zero and the voltage appearing at the output node 12aa is equal to write voltage 60 (FIG. 2), corresponding to the intersection of the curve portion 370a and the curve 364.

When the write enable signal 72a (FIG. 2) is applied, the programming action starts and the antifuse characteristic curve changes from the curve 370 to the curve 354 while the characteristic curve of the fuse 14a remains equal to the curve 364. Such variation on the antifuse 16a causes a new equilibrium point corresponding to the point 362.

At the point 362, power dissipation in the antifuse 16a, and in the transistor 68a (FIG. 2) causes the temperature of the antifuse 16a to rise, wherein the antifuse 16a begins to experience thermal runaway, resulting in a change of characteristic curve of the antifuse 16a from the characteristic curve 354 to the characteristic curve 358. The change of characteristic curve brings the memory cell 12a to a new equilibrium point 366, at which a high memory cell current value 372 is reached.

Upon reaching the high current value 372 at the point 366, the fuse 14a is forced to dissipate power beyond its capabilities causing it to fail, i.e., to open, and to change its characteristic curve from the low impedance unprogrammed characteristic curve 364 to the very high impedance programmed characteristic curve 367. Therefore, a new equilibrium point 342 is achieved at the intersection of the curves 367 and 358, which is essentially representative of zero current and zero voltage. As a result, the memory cell current stops blowing the fuse 14a and the antifuse 16a, and the programming action to be completed.

In one particular embodiment, the high drain current value 372 is about two hundred mA.

The above-described operation can be accomplished for any write voltage 60 (FIG. 2) within the VDD programming window 352 if the associated source resistance, i.e. source resistance of the VDD write driver circuit 56 (FIG. 2) plus resistance of the fuse 14a and all resistive interconnections is kept sufficiently low.

It should be appreciated that the point 348 corresponds to an unprogrammed memory cell 12a. At the point 348, the current through the memory cell is substantially zero. Thus, before programming, the memory cell 12a has very high resistance and draws very little power. It should also be appreciated that, once programming of the memory cell 12a is achieved, reaching the point 342, the current though the memory cell 12a is also substantially zero. Thus, after programming, the memory cell 12a also has very high resistance and draws very little power.

It should also be appreciated that, instead of applying the write voltage 348 first (60, FIG. 2), and then applying the write enable signal 72a (FIG. 2), the reverse arrangement can also be used to program the memory cell. In particular, the write enable signal 72a can be applied first, resulting in the characteristic curve 354 being achieved first, and making the initial equilibrium point equal to that shown as the point 342. Thereafter, the write voltage 60 can be applied to the VDD write bus 10 of FIG. 2, resulting in the FET 16a following the characteristic curve 354 until it reaches the point 362. Programming then proceeds in the way described above.

In some arrangements, the transition from the point 348 to the point 366 is achieved in about one tenth of a microsecond and the final point 342 is reached in about one microsecond from the time the write enable signal 72a is applied.

In some embodiments, the point 350 is in the range of about twelve to fifteen volts, the point 346 is in the range of about seven to nine volts, and the point 348, which is a small amount below the write voltage 60 of FIG. 2, is about ten volts. In some embodiments, the point 366 is at about two hundred mA.

In some embodiments, the antifuse, for example the antifuse 16a of FIG. 2, is made from a CMOS or BiCMOS semiconductor process, has a gate width of about one micrometer, a gate length of about one micrometer.

In some embodiments, the fuse, for example, the fuse 14a of FIG. 2, is made from an aluminum metalized layer, has an unprogrammed resistance of about 0.5 ohms, a thickness of about one micrometer, a width of about one micrometer and a length of about five micrometers. In some embodiments, the write driver circuit, for example, the write driver circuit 56 of FIG. 2 has an output resistance of about twenty ohms.

A point 344 corresponds to a read voltage, for example, the read voltage 66 of FIG. 2, below voltages of the programming window 354.

While the voltages of the graph 340 are representative of voltages associated with the memory array 50 of FIG. 2, it will be appreciated that similar voltages and operation are associated with the memory 200 of FIG. 4. It will also be appreciated that, since the memories 120, 270 of FIGS. 3 and 5 operate with write voltages applied to the VSS voltage buses, 38, 18, respectively, voltages below the VDD voltage buses 30, 10 must be applied for those memories. However, one of ordinary skill in the art will be capable of identifying appropriate voltages based upon the graph 340.

Figure 7:
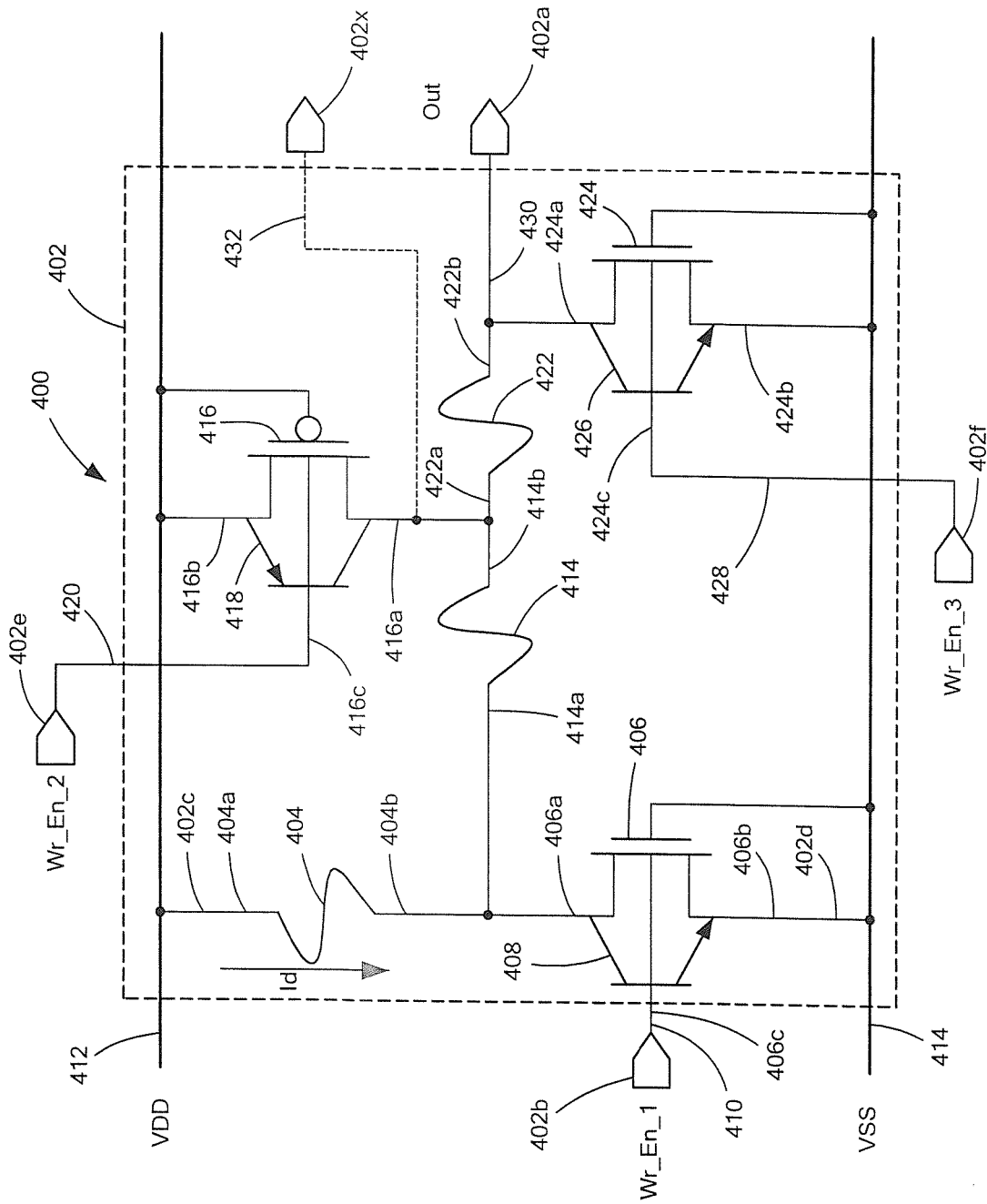
FIG. 7 is a block diagram showing an exemplary non-volatile re-programmable memory cell, which can be programmed and then re-programmed two times.

Referring now to FIG. 7, a non-volatile re-programmable memory cell 400 includes a first fuse 404 having a first node 404a and a second node 404b. The memory cell 400 also includes a first antifuse 406 having a trigger node 406c, a first node 406a, and a second node 406b. The first node 406a of the first antifuse 406 coupled to the second node 404b of the first fuse 404. The memory cell 400 also includes a second fuse 414 having a first node 414a and a second node 414b. The first node 414a of the second fuse 414 is coupled to the second node 404b of the first fuse 404. The memory cell 400 also includes a second antifuse 416 having a trigger node 416c, a first node 416a, and a second node 416b. The first node 416a of the second antifuse 416 is coupled to the second node 414b of the second fuse 414. The second node 416b of the second antifuse 416 is coupled to the first node 404a of the first fuse 404.

In a one-time re-programmable arrangement, the first node 416a of the second antifuse 416 and the second node 414b of the second fuse 414 are coupled to an optional memory cell output node 402x. With this arrangement, upon a first programming, the first antifuse 406 is fused to a low resistance condition and the first fuse 404 is blown to a high resistance condition by application of a first write signal 410 to a first write enable node 402b while a write voltage is applied to the VDD voltage bus 412. Upon a first re-programming, the second antifuse 416 is fused to a low resistance condition and the second fuse 414 is blown to a high resistance condition by application of a write signal 420 to a second write enable node 402e while the write voltage is applied to the VDD voltage bus 412.

It will be appreciated that, in the above-described one-time re-programmable arrangement, a third fuse 422 and a third antifuse 424 are not used. For these arrangements, in operation, a signal 432 having a first or a second voltage appears at the memory cell output node 402x when a read voltage is applied between the VDD voltage bus 412 and the VSS voltage bus 414. The first and second voltages are indicative of first and second binary states of the memory cell 400 when programmed and also when re-programmed.

However, in a two times re-programmable arrangement, the non-volatile re-programmable memory cell 400 also includes the third fuse 422 having a first node 422a and a second node 422b. In these arrangements, the memory cell 400 can also include the third antifuse 424 having a trigger node 424c, a first node 424a, and a second node 424b. The first node 424a of the third antifuse 424 coupled to the second node 422b of the third fuse 422. The first node 424a of the third antifuse 424 and the second node 422b of the third fuse 422 are coupled to a memory cell output node 402a.

The first re-programming is discussed above. To achieve the second re-programming, the third antifuse 424 is fused to a low resistance condition and the third fuse 422 is blown to a high resistance condition by application of a third write signal 428 to a third write enable node 402f while the write voltage is applied to the VDD voltage bus 412.

For embodiments having all the fuses and antifuses shown, in operation, a signal 430 having the first or the second voltage appears at the memory cell output node 402a, and the memory cell output node 402x is not used. The first or second voltage appears when a read voltage is applied between the VDD voltage bus 412 and the VSS voltage bus 414. The first and second voltages are indicative of first and second binary states of the memory cell 400 before programming, when programmed, when re-programmed a first time, and when re-programmed a second time.

While the memory cell 400 is configured to allow one programming and two re-programmings, it will be appreciated that other memory cells having more fuses and more antifuses can provide more than three programmings.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A memory cell, comprising:
a memory cell write enable node and a memory cell output node;
a fuse having a first node and a second node; and
an antifuse having a trigger node, a first node, and a second node, wherein the trigger node is coupled to the memory cell write enable node, wherein the first node of the antifuse and the second node of the fuse are coupled to the memory cell output node, wherein first and second voltages appearing at the memory cell output node are indicative of first and second binary states of the memory cell.

2. The memory cell of claim 1, wherein initially, before programming the memory cell, the fuse has a lower initial resistance between the first node and the second node of the fuse compared to a higher initial resistance of the antifuse between the first node and the second node of the antifuse.

3. The memory cell of claim 2, wherein, after programming the memory cell, the fuse has a higher programmed resistance between the first node and the second node of the fuse compared to the lower initial resistance of the fuse, and the antifuse has a lower programmed resistance between the first node and the second node of the antifuse compared to both the higher initial resistance of the antifuse and the higher programmed resistance of the fuse.

4. The memory cell of claim 3, wherein initially, before programming the memory cell, a resistance between the first node of the fuse and the second node of the antifuse is greater than about one megohm, and wherein, after programming the memory cell, the resistance between the first node of the fuse and the second node of the antifuse is also greater than about one megohm.

5. The memory cell of claim 3, wherein, during a reading of the memory cell, the memory cell has substantially the same power consumption before and after programming the memory cell.

6. The memory cell of claim 3, wherein the memory cell has substantially the same resistance between the first node of the fuse and the second node of the antifuse before and after programming the memory cell.

7. The memory cell of claim 3, wherein the first node of the fuse and the second node of the antifuse are coupled to receive a write voltage difference during the programming of the memory cell.

8. The memory cell of claim 7, wherein the first node of the fuse and the second node of the antifuse are coupled to receive a read voltage difference during a reading of the memory cell.

9. The memory cell of claim 8, wherein the read voltage difference is different than the write voltage difference.

10. The memory cell of claim 1, wherein, during programming of the memory cell from the first binary state to the second binary state, a predetermined write voltage is applied across the first node of the fuse and the second node of the antifuse, the antifuse is configured to receive a predetermined voltage-current signal at the trigger node, and, in response to the predetermined voltage-current signal, the antifuse is configured to irreversibly change resistance to have a lower programmed resistance between the first node and the second node of the antifuse compared to a higher initial resistance of the antifuse, and, in response to the antifuse changing resistance, the fuse is configured to irreversibly change resistance to have a higher programmed resistance between the first node and the second node of the fuse compared to a lower initial resistance of the fuse and also compared to the lower programmed resistance of the antifuse, resulting in a change of the voltage appearing at the memory cell output node from the first voltage to the second voltage when a read voltage is applied between the first node of the fuse and the second node of the antifuse.

11. A memory array comprising a plurality of memory cells, the plurality of memory cells comprising:
a corresponding plurality of memory cell write enable nodes and a corresponding plurality of memory cell output nodes;
a corresponding plurality of fuses, each fuse having a first respective node and a second respective node; and
a corresponding plurality of antifuses, each antifuse having a respective trigger node, a respective first node, and a respective second node, wherein the trigger node of each fuse is coupled to respective one of the plurality of memory cell write enable nodes, wherein the second node of each fuse and the first node of each antifuse are coupled to a respective one of a plurality of memory cell output nodes, wherein respective first and second voltages appearing at each one of the plurality of memory cell output nodes are indicative of respective first and second binary states of each respective one of the plurality of memory cells.

12. The memory array of claim 11, wherein initially, before programming a selected one of the plurality of memory cells having a respective fuse and a respective antifuse, the respective fuse has a lower initial resistance between the first node and the second node of the respective fuse compared to a higher initial resistance of the respective antifuse between the first node and the second node of the respective antifuse.

13. The memory array of claim 12, wherein, after programming the selected one of the plurality of memory cells, the respective fuse has a higher programmed resistance between the first node and the second node of the respective fuse compared to the lower initial resistance of the respective fuse, and the respective antifuse has a lower programmed resistance between the first node and the second node of the respective antifuse compared to both the higher initial resistance of the respective antifuse and the higher programmed resistance of the fuse.

14. The memory array of claim 13, wherein initially, before programming the selected one of the plurality of memory cells, a resistance between the first node of the respective fuse and the second node the respective antifuse is greater than about one megohm, and wherein, after programming the selected memory cell, the resistance between the first node of the respective fuse and the second node of the respective antifuse is also greater than about one megohm.

15. The memory array of claim 13, wherein the selected one of the plurality of memory cells has substantially the same power consumption before and after programming the selected memory cell.

16. The memory array of claim 13, wherein the selected one of the plurality of memory cells has substantially the same resistance between the first node of the respective fuse and the second node of the respective antifuse before and after programming the selected memory cell.

17. The memory array of claim 11, further including a write driver circuit configured to generate a write voltage difference between the first node of each one of the plurality of fuses and the second node of each one of the plurality of antifuses during a programming of the memory array.

18. The memory array of claim 17, further including a read driver circuit configured to generate a read voltage difference between the first node of each one of the plurality of fuses and the second node of each one of the plurality of antifuses during a reading of the memory array.

19. The memory array of claim 18, wherein the read voltage difference is different than the write voltage difference.

20. The memory array of claim 11, wherein, during programming of a selected one of the plurality of memory cells from the first binary state to the second binary state, a write voltage-is applied across the first node of each one of the plurality of fuses and the second node of each one of the plurality of antifuses, wherein the selected one of the plurality of memory cells has a respective fuse and a respective antifuse, the respective antifuse is configured to receive a predetermined voltage-current signal at the respective trigger node, and, in response to the predetermined voltage-current signal, the respective antifuse is configured to irreversibly change resistance to have a lower programmed resistance between the first node and the second node of the respective antifuse compared to a higher initial resistance of the respective antifuse and, in response to the respective antifuse changing resistance, the respective fuse is configured to irreversibly change resistance to have a higher programmed resistance between the first node and the second node of the respective fuse compared to a lower initial resistance of the respective fuse and also compared to the lower programmed resistance of the antifuse, resulting in a change of the voltage appearing at the memory cell output node of the selected one of the plurality of memory cells from the first voltage to the second voltage when a read voltage is applied between the first node of the fuse and the second node of the antifuse.

21. A memory cell, comprising:
first and second memory cell write enable nodes and a memory cell output node;
a first fuse having a first node and a second node;
a first antifuse having a trigger node, a first node, and a second node, wherein the first node of the first antifuse is coupled to the second node of the first fuse, wherein the trigger node of the first antifuse is coupled to the first memory cell write enable node;
a second fuse having a first node and a second node, the first node of the second fuse coupled to the second node of the first fuse; and
a second antifuse having a trigger node, a first node, and a second node, wherein the trigger node of the second antifuse is coupled to the second memory cell write enable node, wherein the first node of the second antifuse and the second node of the second fuse are coupled to the memory cell output node, and wherein the second node of the second antifuse is coupled to the first node of the first fuse.

22. The memory cell of claim 21, wherein the first fuse, initially, before programming, has a relatively low initial resistance between the first node and the second node of the first fuse, the first antifuse, initially, before programming, has a relatively high initial resistance between the first node and the second node of the first antifuse, the second fuse initially, before programming, has a relatively low initial resistance between the first node and the second node of the second fuse, and the second antifuse, initially, before programming, has a relatively high initial resistance between the first node and the second node of the second antifuse.

23. The memory cell of claim 22, wherein initially, before programming the memory cell, a resistance between the first node of the first fuse and the second node of the first antifuse is greater than about one megohm, and wherein, after programming the memory cell, the resistance between the first node of the first fuse and the second node of the first antifuse is also greater than about one megohm.

24. The memory cell of claim 22, wherein the first node of the first fuse and the second node of the first antifuse are coupled to receive a write voltage difference during the programming of the memory cell.

25. The memory cell of claim 24, wherein the first node of the first fuse and the second node of the first antifuse are coupled to receive a read voltage difference during the reading of the memory cell.

26. The memory cell of claim 25, wherein the read voltage difference is different than the write voltage difference.

27. The memory cell of claim 21, wherein, during programming of the memory cell from a first binary state to a second binary state, a predetermined write voltage is applied across the first node of the first fuse and the second node of the first antifuse, the first antifuse is configured to receive a first predetermined voltage-current signal at the trigger node of the first antifuse, and, in response to the first predetermined voltage-current signal, the first antifuse is configured to irreversibly change resistance to have a lower programmed resistance between the first node and the second node of the first antifuse compared to the higher initial resistance, and, in response to the first antifuse changing resistance, the first fuse is configured to irreversibly change resistance to have a higher programmed resistance between the first node and the second node of the first fuse compared to the lower initial resistance of the first fuse and also compared to the lower programmed resistance of the first antifuse, resulting in a change of the voltage appearing at the second node of the second fuse from a first voltage to a second voltage when a read voltage is applied between the first node of the first fuse and the second node of the first antifuse, and wherein, during re-programming of the memory cell from the second binary state to the first binary state, the second antifuse is configured to receive a second predetermined voltage-current signal at the trigger node of the second antifuse, and, in response to the second predetermined voltage-current signal, the second antifuse is configured to irreversibly change resistance to have a lower reprogrammed resistance between the first node and the second node of the second antifuse compared to the higher initial resistance and, in response to the second antifuse changing resistance, the second fuse is configured to irreversibly change resistance to have a higher reprogrammed resistance between the first node and the second node of the second fuse compared to the lower initial resistance of the second fuse and also compared to the lower programmed resistance of the second antifuse, resulting in a change of the voltage appearing at the second node of the second fuse from the second voltage to the first voltage when a read voltage is applied between the first node of the first fuse and the second node of the first antifuse.

* * * * *

UNITED STATES PATENT AND TRADEMARK OFFICE
CERTIFICATE OF CORRECTION

PATENT NO. : 7,715,219 B2
APPLICATION NO. : 12/164221
DATED : May 11, 2010
INVENTOR(S) : Gerardo Monreal It is certified that error appears in the above-identified patent and that said Letters Patent is hereby corrected as shown below:

Col. 3, line 19, delete "is can be" and replace with --can be--

Col. 3, line 53, delete ", the a" and replace with --, the--

Col. 4, line 40, delete "o" and replace with --of--

Col. 7, lines 38-39, delete "transistor" and replace with --transistors--

Col. 8, line 50, delete "drive" and replace with --driver--

Col. 9, line 27, delete "30" and replace with --38--

Col. 9, line 43, delete "30" and replace with --38--

Col. 10, line 16, delete "32" and replace with --30--

Col. 12, line 19, delete "above described" and replace with --above-described--

Col. 12, line 35, delete "characteristics" and replace with --characteristic--

Col. 12, line 45, delete "zero" and replace with --zero.--

Col. 13, line 23, delete "action to be" and replace with --action is--

Col. 13, line 38, delete "though" and replace with --through--

Col. 14, line 66, delete "coupled" and replace with --is coupled--

Col. 16, line 45, delete "to" and replace with --to a--

Col. 17, line 7, delete "node the" and replace with --node of the--

Signed and Sealed this

Second Day of November, 2010

David J. Kappos
*Director of the United States Patent and Trademark Office*

Col. 17, line 36, delete "voltage-is" and replace with --voltage is--